United States Patent [19]
Wise

[11] Patent Number: 4,890,015
[45] Date of Patent: Dec. 26, 1989

[54] METHOD AND CIRCUITRY FOR CONTROLLING THE COMPENSATION OF NEGATIVE INTERNAL GROUND VOLTAGE FLUCTUATIONS

[75] Inventor: Janet L. Wise, Sherman, Tex.

[73] Assignee: Texas Instruments Incorporated, Dallas, Tex.

[21] Appl. No.: 149,776

[22] Filed: Jan. 29, 1988

[51] Int. Cl.⁴ ............... H03K 19/013; H03K 19/088
[52] U.S. Cl. ........................... 307/443; 307/456; 307/458; 307/542; 307/544
[58] Field of Search ............ 307/443, 456–458, 307/475, 542, 544, 549, 560

[56] References Cited

U.S. PATENT DOCUMENTS

| | | | |
|---|---|---|---|
| 4,103,181 | 7/1978 | Moreau | 307/296.4 |
| 4,321,490 | 3/1982 | Bechdolt | 307/458 |
| 4,330,723 | 5/1982 | Griffith | 307/458 |
| 4,481,430 | 11/1984 | Houk et al. | 307/296.4 |
| 4,542,331 | 9/1985 | Boyer | 307/458 |
| 4,593,210 | 6/1986 | Boyer | 307/443 |
| 4,634,898 | 1/1987 | Gouldsberry et al. | 307/456 |
| 4,682,050 | 7/1987 | Beranger et al. | 307/456 |

Primary Examiner—Andrew J. James
Assistant Examiner—Timothy P. Callahan
Attorney, Agent, or Firm—George L. Craig; Thomas W. DeMond; Melvin Sharp

[57] ABSTRACT

Circuitry for controlling the operation of a transient voltage compensation circuit is disclosed. An input buffer circuit 10 is provided which includes a phase splitter transistor 30 having a base at which input signals are applied and an emitter which is coupled to internal ground through Schottky diode 32. A compensation circuit 12 prevents the undesirable switching of transistor 30 during fluctuations in the internal ground voltage level by drawing current from the base of transistor 30 through transistor 42 which has a base connected to a source of current and an emitter connected to internal ground. Transients in the internal ground level effect the turn on of transistor 42 which prevents the turn on of transistor 30 under low input voltage conditions. A compensation control circuit 11 is provided to disable compensation circuit 12 under high input voltage conditions yet allow its normal operation when a low voltage level is applied at the input. A high voltage level on the input (and also the base of transistor 30) turns transistor 25 off allowing its base to rise to a voltage level sufficient to overcome the threshold voltage set by diodes 23 and 24 and transistor 18. When transistor 18 turns on current is drawn from the base of transistor 42 turning it off which disables compensation circuit 12 and ensures a stable high level on the base of transistor 30.

18 Claims, 3 Drawing Sheets

4,890,015

METHOD AND CIRCUITRY FOR CONTROLLING THE COMPENSATION OF NEGATIVE INTERNAL GROUND VOLTAGE FLUCTUATIONS

BACKGROUND OF THE INVENTION

The present invention relates to electronic circuits and, more specifically, to methods and circuitry for preventing undesirable output voltage fluctuations in integrated circuitry.

Integrated circuits incorporating multiple output devices often have undesirable output signal fluctuations which are caused by negative ground voltage variations. Such transient behavior may be caused by the simultaneous switching of many multiple output devices which in turn causes excess current to be injected into the internal ground of the integrated circuit. The internal ground nodes of such circuits are connected to an external ground node (fixed at zero volts) through a package pin which includes an inherent inductance. As excess current is injected into the internal and external ground nodes, both positive and negative internal ground voltage fluctuations are established as described by the inductor-voltage equation $V = L\, di/dt$.

If only one output is switched, the current discharged from the load will cause only small fluctuations in circuit ground voltage. However, as the number of output devices switched increases, the circuit ground voltage level moves significantly. Since the input pin is connected to an external reference that does not vary with circuit ground, a large voltage develops across the input circuitry as the circuit ground goes negative. If the input is in the low state (Vil=0.5 volts) the voltage across the input circuit (Vil − Vground) may be greater than the device threshold (Vth = 2 Vbe), causing the input voltage to appear to be at a high level momentarily and causing an undesirable transition in output voltage.

In particular, the negative ground voltage fluctuations, often termed spikes or glitches, cause transistors in the integrated circuitry to prematurely turn on when the transistors' emitters are referenced to internal ground and their bases are referenced to the external voltage supply. When such transistors prematurely turn on, the output of the circuitry often begins to oscillate and creates undesirable output signal fluctuations. Such internal ground voltage fluctuations will become increasingly worse as circuit designers strive to obtain even faster switching of multiple output devices.

A need has thus arisen for compensation circuitry which can prevent or eliminate undesirable output signal fluctuations caused by internal ground voltage transitions. In particular, a need has arisen for controlling the effects caused by severe negative internal ground voltage fluctuations created by rapid switching of multiple output devices. Such compensation circuitry should be useful with both transistor and diode input devices, and should be controllable as to the level of compensation control.

One technique to remedy the above problem is the subject matter of co-pending application Ser. No. 07/149,767 assigned to Texas Instruments Incorporated.

A second technique is set forth in application Ser. No. 881,146, filed Jul. 2, 1986, assigned to the assignee of the present invention, wherein a circuit referenced through a capacitor to Vcc is used. This circuit may be particularly useful in designs such as those as shown in FIG. 2 wherein one buffer (10) including a driver having an emitter referenced to ground drives numerous gates (60) that are simultaneously switched during normal operation. The simultaneous switching causes movement in the internal ground level which in turn causes the undesirable switching of the driver and oscillations in the multiple gates. The above circuit is designed to compensate for the ground movement by controlling the state of the one driver transistor under low level input conditions. While this circuit provides the needed compensation for designs such as those described above, circuits such as those shown in FIG. 3 designed with multiple buffers 10) and multiple gates (60), may require added degree of control. An additional technique is set forth in the application of Susan A. Curtis, Ser. No. 942,554, filed Dec. 16, 1986, assigned to the assignee of the present invention, wherein there is added to the compensation circuit of the application discussed above a feedback transistor Q202 and a resistor R201. These elements provide for the inhibition of the compensation circuit in the event that an increase in voltage difference between the input to the circuit being protected and ground is a result of a high input signal rather than noise which lowers the ground level. This control is made possible by connecting the added transistor (Q202) to a node that is at a one VCE(on) level and out of phase with the input.

Accordingly, it would be desirable to design a transient compensation control circuit that operates directly from input voltage levels and that is not in the direct path of existing circuitry. In addition, it would be desirable that such a circuit not be controlled in any way by the transistor being influenced by the compensation circuitry.

SUMMARY OF THE INVENTION

In accordance with the present invention, there is provided a transient compensation circuit which enables the desired result of compensating for negative internal ground voltage fluctuations while, at the same time, minimizing the negative effects of the previous circuits as described hereinabove. These characteristics are made possible by the present invention wherein a compensation circuit is designed to be responsive to a negative shift in the level of ground relative to the Vcc (supply) voltage level and is controlled by circuitry that is directly responsive to the input voltage level. The compensation circuit negates any internal ground voltage fluctuations which may affect an output transistor having a base for receiving input signals, a collector for generating output signals and an emitter coupled to internal circuit ground. The compensation circuitry is connected to the transistor base and supplies current which pulls down the voltage across the base in response to negative transitions in the internal ground voltage level. As a result, the output transistor is prevented from switching to the on state during the ground level transition and a reliable output level is maintained.

The design further includes control circuitry which regulates the operation of the compensation circuit described above. This is accomplished by providing a switching circuit that is transistor coupled between ground and the base of a similar transistor in the compensation circuit. The second transistor provides the ability to prevent the undesirable switching of the output transistor and is controlled by the first transistor. The first transistor is in turn controlled by the voltage level at the input. This is made possible by including an additional transistor that is connected to the base of the first transistor and whose switching state is directly controlled by the input logic state. In this manner, the operation avoids the problems associated with designs that require internally generated reference voltages. Furthermore, by providing for direct control by the input voltage level, the design eliminates the potential loss of reliability associated with undesirable propagation delays. This becomes even more significant as circuit operating speeds increase.

BRIEF DESCRIPTION OF THE DRAWINGS

Further features and advantages of the present invention will become apparent from the description of the following embodiment, taken in conjunction with the accompanying drawings, in which.

DETAILED DESCRIPTION OF THE PREFERRED EMBODIMENT

Figure 1:
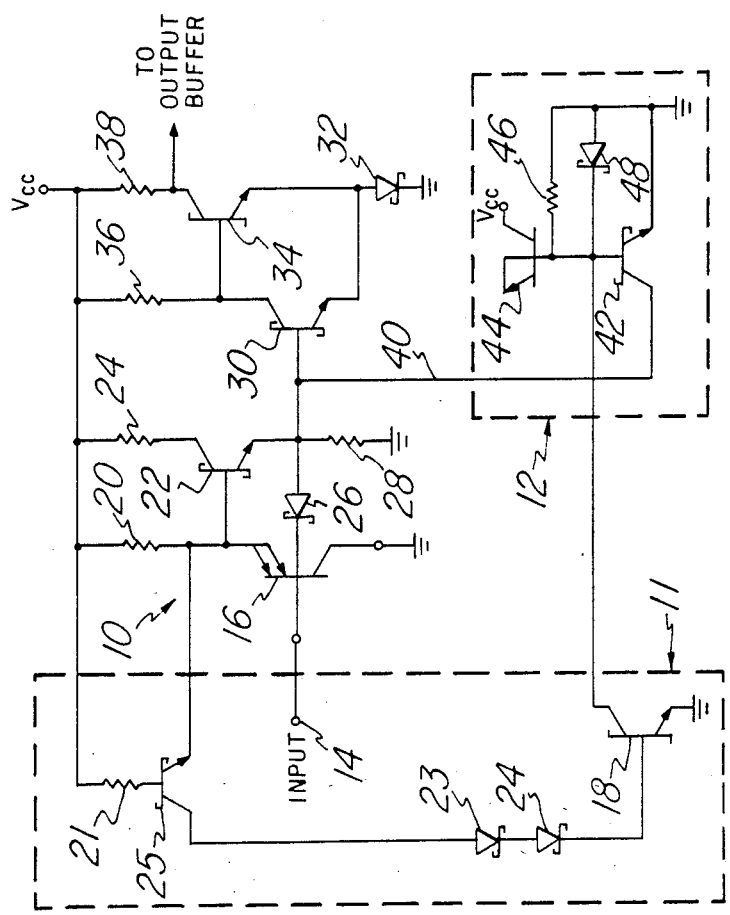
FIG. 1 is a schematic diagram of a preferred embodiment of the invention.
Figure 2:
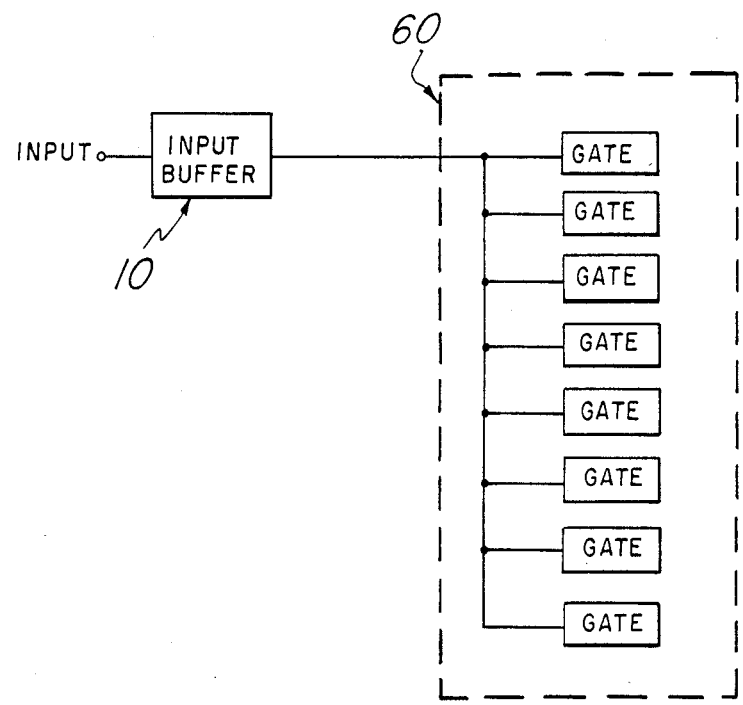
FIG. 2 is a block diagram of a single input buffer driving multiple output gates.
Figure 3:
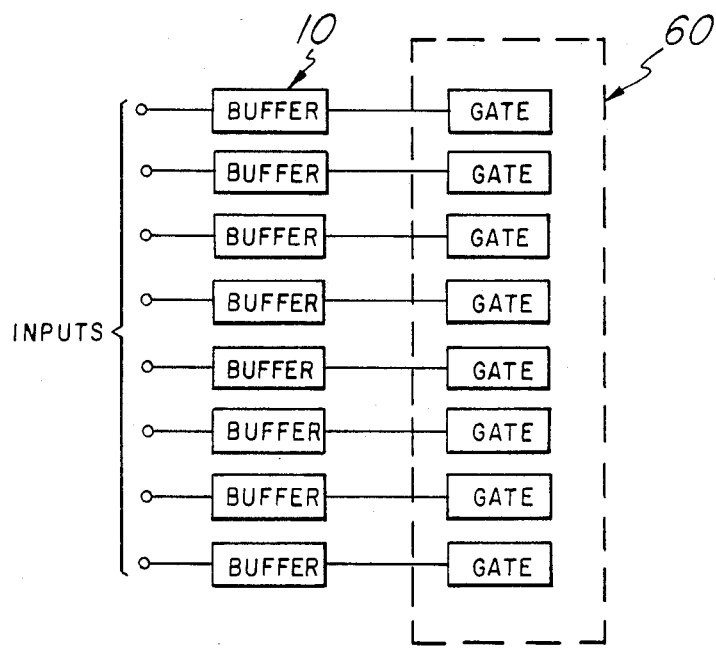
FIG. 3 is a block diagram of multiple input buffers driving multiple output gates.

FIG. 1 illustrates a typical TTL input circuit 10 which is subject to problems caused by internal ground voltage fluctuations. To overcome such problems, negative transient compensation circuitry as shown within the dotted line 12 and compensation control circuitry as shown within dotted line 11 are provided. As will be subsequently described, the present negative transient compensation circuitry 12 under the control of compensation control circuitry 11 eliminates the deleterious effects of internal ground voltage fluctuations on circuit 10. While the circuit 10 will be specifically described to illustrate the operation of the present control circuitry 11 and its effect on compensation circuitry 12, it will be understood that the present invention may be utilized with many types of circuits which have an input referenced to a fluctuating ground voltage. As shown in FIG. 2, an input circuit such as shown by circuit 10 is frequently used in integrated circuits to rapidly switch multiple output gates (60). In many instances, a number of such circuits is connected to an external ground reference potential through conventional interconnects and a device package pin which are not shown.

Referring still to FIG. 1, the input circuit 10 includes an input node 14 which receives input signals from, for instance, an external source. The input node 14 is connected to the base of dual emitter transistor 16 which has a collector connected to internal ground and the emitters connected to both the base of a Schottky clamped emitter follower transistor 22 and one end of a resistor 20 which has its other end connected to the supply voltage Vcc. Transistor 22 has a collector connected to supply voltage Vcc through a resistor 24 and an emitter connected to the base of a phase splitter, Schottky clamped transistor 30. The base of transistor 30 is also connected to a resistor 28 which is coupled to ground and the anode of diode 26 which has a cathode connected to the base of input transistor 16. The collector of transistor 30 is connected to an output Schottky clamped transistor 34 and also to one end of resistor 36 which has a second end connected to Vcc. The emitters of both transistors 30 and 34 are connected to the anode of diode 32 which has a cathode connected to ground. Finally, the input circuit 10 has a resistor 38 connected at one end to the collector of output transistor 34 and a second end connected to the supply voltage Vcc.

The circuit as described to this point does not provide for the compensation of negative voltage transients on the internal ground node which may adversely affect proper operation in the following manner. With reference still to FIG. 1, it can be seen that the output voltage level at the collector of transistor 34 is in turn controlled by the switching state of transistor 30 which drives the base of transistor 34. Transistor 30 is driven by the input buffer circuitry and, together with diode 32, establishes the threshold voltage of the circuit. Clearly, the proper on/off condition of transistor 30 is critical to maintaining the correct logic state at the circuit output. As mentioned above, the internal circuit ground node is connected to external ground through interconnects and a package pin which operates as an inductive element when current is injected into circuit ground during transistor switching. This inductive element creates voltage fluctuations on the internal ground (as described by the equation $V = L \, di/dt$). Since the emitter of transistor 30 is referenced to internal ground through diode 32 and the base is referenced to an external voltage supply (the input voltage), transistor 30 may erroneously turn on during negative transitions in the internal ground voltage.

The above malfunction may be remedied by incorporating transient compensation circuitry which operates under the control of the compensation control circuit of the present invention. Referring again to FIG. 1, the compensation circuitry is shown within the dotted line 12. The circuit includes Schottky clamped transistor 42 which has a collector connected to the base of transistor 30 described above. Transistor 42 has a base connected to the base of transistor 44, the cathode of Schottky diode 48, and one terminal of a resistor 46. The anode of diode 48 and the opposite end of resistor 46 are connected to the internal ground node. Transistor 44 has a collector connected to the external supply voltage Vcc and an emitter that is connected to the base of transistor 44. This connection forms an emitter to base junction capacitor.

Circuit 12 is controlled by the compensation control circuitry outlined in FIG. 1 by the dotted line 11. This circuitry includes Schottky clamped transistor 18 which has a collector connected to the base of transistor 42 described above and an emitter that is connected to the internal ground node. Transistor 18 also has a base which is connected to the cathode of Schottky diode 24. An optional pull down resistor may be added to the base of transistor 18 to ensure the rapid turn-on and turn-off of this device. The anode of diode 24 is connected to the cathode of Schottky diode 23 and the anode of diode 23 is connected to the collector of Schottky clamped transistor 25. Transistor 25 has a base that is connected to one terminal of a resistor 21 which has a second terminal connected to the external supply voltage Vcc. The emitter of transistor 25 is connected to the emitters of the dual emitter transistor 16 described previously.

Referring to FIG. 1, the operation of the compensation circuit and the control circuitry of the invention will be described in detail. This operation can best be described by assuming the voltage across a Schottky diode to be 0.65 volts and the base to emitter and collector to emitter voltages of a transistor operating in the active region to be 0.8 volts and 0.25 volts respectively. Assuming a 0.5 volt logic level "0" is applied to the input node 14, transistor 16 will turn on which applies 0.5 volts to the base of transistor 30 (0.5 volts + Vbe transistor 16 — Vbe transistor 22. Transistor 30 remains off since approximately 1.45 volts (Vbe transistor 30 + Vsd diode 32) must be applied to the base of transistor 30 to effect turn on. As generally described above, negative fluctuations in the internal ground voltage level may cause the undesirable turn on of transistor 30. Assuming that this voltage level temporarily drops to −1.0 volt, the emitter of transistor 30 will correspondingly drop to −1.0 volt + Vsd of diode 32 = −0.35 volts. Since the base voltage remains at 0.5 volts, the base to collector voltage becomes 0.85 volts which is sufficient to turn on transistor 30 causing the output to switch in error as described above.

By adding the compensation circuitry 12 of FIG. 1 the above condition may be alleviated. As the internal ground voltage level makes a negative transition, the voltage at the emitter of transistor 42 drops accordingly. The transistor (junction capacitor) 44 supplies current to the base of transistor 42 which turns on when the emitter voltage (ground) is one Vbe below the voltage on the base. This action in turn forces the base of transistor 30 to approximately 0.25 volts (Vce transistor 42) above the internal ground voltage level which ensures that transistor 30 remains in the off condition. The diode 48 assists in maintaining a positive bias on the base of transistor 42 during positive transitions in the internal ground voltage which enhances response time at the onset of a negative transition. As mentioned previously, the compensation technique described to this point operates at the occurrence of a sufficient fluctuation in ground voltage Without the additional compensation control circuitry described hereinbelow, it is possible for transistor 42 to turn on when the input (and the base of transistor 30) is high and either negative fluctuations in ground or positive fluctuations in the supply voltage Vcc are present. This condition in turn causes transistor 30 to turn off momentarily and the output at the collector of transistor 34 to erroneously change to a high logic state.

The compensation control circuit of the present invention provides significant improvement in performance. This is particularly true in the case of circuits designed with multiple buffers driving multiple gates such as shown in FIG. 2 wherein it is desirable to have the compensation controlled by the state of the input. As shown in FIG. 1, the compensation control circuitry is outlined by dotted line 11. The operation of this circuitry can best be described by again assuming the voltage across a Schottky diode to be 0.65 volts and the base to emitter and the collector to emitter voltages of a transistor operating in the active region to be 0.8 volts and 0.25 volts respectively. Assuming a logic 0 of 0.5 volts is applied to input node 14, dual emitter PNP transistor 16 will turn on. This action forces the base of transistor 25 to 0.5 volts + Vbe transistor 16 (on) + Vbe transistor 25 (on) =2.1 volts. Under this condition, transistor 18 is in the off state because the voltage required on the base of transistor 25 to effect the turn on of transistor 18 is Vbe transistor 18 (on) + Vsd diode 23 (on) + Vsd diode 24 (on) + Vsd transistor 25 (on) =2.75 volts. This threshold voltage may be adjusted by adding an additional Schottky diode in series with diodes 23 and 24. With transistor 18 off there is no effect on the normal operation of compensation circuitry 12 and the effects of negative internal ground fluctuations are eliminated as described above for the case where a logic 0 is applied to the input.

Assuming a logic "1" of 3.0 volts is applied to the input 14, dual emitter PNP transistor 16 and transistor 25 are in the off state and the voltage on the base of transistor 25 is allowed to rise to a level sufficient to turn transistor 18 on. The switching of transistor 18 to the on state pulls current from the base of transistor 42 through the collector of transistor 18 which prevents the compensation circuitry from pulling current from the base of transistor 30. It can therefore be seen that the compensation control circuitry 11 provides the important function of ensuring the proper operation of the compensation circuitry under certain operating conditions.

Figure 4:
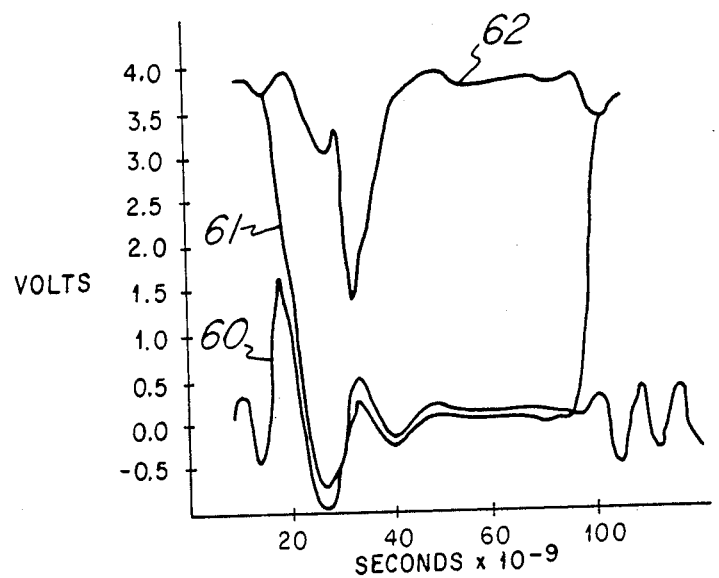
FIG. 4 is a graph illustrating the simulated transient behavior of the output voltage levels for the circuit of the preferred embodiment without the compensation control circuit of the present invention.
Figure 5:
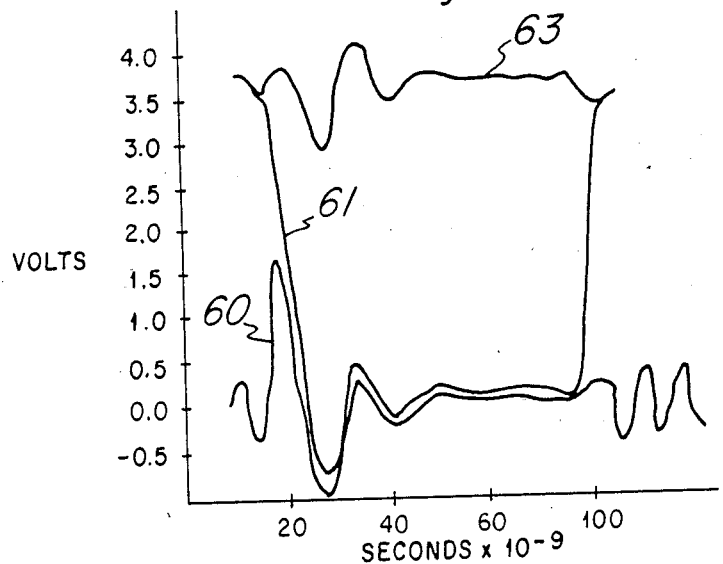
FIG. 5 is a graph illustrating the simulated transient behavior of the output voltage levels for the circuit of the preferred embodiment with the compensation control circuit of the present invention.

Finally, with reference to FIGS. 4 and 5, there are shown simulated waveforms depicting the improved performance made possible by the present invention.

The graph of FIG. 4 illustrates the switching of, for example, seven outputs shown as trace 61 with one output remaining high and shown as trace 62, without the controlled compensation circuit. Trace 60 represents the ground voltage which experiences a transient as described above. The graph of FIG. 5 illustrates the same conditions as those of FIG. 4 except that the controlled compensation circuitry has been added. Again, trace 60 represents the ground voltage, and trace 61 depicts the voltage on the low going outputs. Trace 63 represents the output high voltage now having minimal fluctuation as a result of the operation of the controlled compensation circuit.

I claim:

1. A circuit for controlling the compensation of electrical transients in an integrated circuit comprising:
   an input circuit including an output transistor having a control terminal for receiving an input signal and providing an output signal in response to said input signal;
   a compensation circuit coupled to said input circuit for controlling switching of said output transistor in response to said electrical transients, said compensation circuit including a compensation transistor having a first collector coupled to said control terminal, a first emitter coupled to a reference node and a first base for receiving a control signal;
   a first transistor having a second base, a second collector coupled to said first base to supply said control signal to said compensation circuit and a second emitter coupled to said reference node, said first transistor switchably controlling said compensation circuit; and
   a second transistor having a third collector coupled to said second base, a third base coupled to a source of supply voltage and to said input circuit and a third emitter coupled to said input circuit, said third base responsive to the voltage level of said input signal for switchably regulating said first transistor.

2. A circuit as recited in claim 1, further comprising two diodes connected in series between said third collector and said second base to raise the threshold voltage of said circuit for controlling the compensation of electrical transients.

3. A circuit as recited in claim 2, further comprising a resistor connected between the third base of said second transistor and said source of supply voltage for providing the bias to said transistor.

4. A circuit as recited in claim 1, wherein said electrical transients are negative voltage levels with respect to an internal circuit ground reference level.

5. A circuit as recited in claim 2, wherein the voltage level of said input signal is referenced to an external ground reference level.

6. A circuit as recited in claim 1, wherein said second transistor is off when the voltage level of said input signal is a logical high level.

7. A circuit as recited in claim 1, wherein said first and second transistors are Schottky clamped transistors.

8. A method of controlling the compensation of voltage transients in an integrated circuit comprising the steps of:
  applying an input signal to the base of an output transistor which has an emitter coupled to an internal ground node;
  activating a compensation circuit to reduce the magnitude of the voltage on the base of said output transistor in response to fluctuations in the level of the voltage on said internal ground node to prevent the turn on of said output transistor when said fluctuations are present and said input signal is at a selected level; and
  controlling said step of reducing by actively coupling an input to said compensation circuit to said internal ground node in response to a signal that is electrically in phase with said input signal.

9. A method as recited in claim 8, wherein said step of reducing includes grounding the base of said output transistor by switching a grounding transistor which has an emitter coupled to said internal ground node.

10. A method as recited in claim 9, wherein said step of controlling includes grounding the base of said grounding transistor to thereby prevent the grounding of the control transistor base.

11. A method as recited in claim 8, wherein said selected level is a logical low level.

12. A circuit for controlling the compensation of electrical transients on a reference node in an integrated circuit comprising:
  input means, including an output transistor, for providing an output signal in response to an input signal;
  voltage transient compensation means coupled to said input means to prevent the switching of said output transistor only in response to said electrical transients; and
  control means to disable said voltage transient compensation means by actively coupling said compensation means to said reference node in response to a signal that is electrically in phase with said input signal.

13. A circuit as recited in claim 12, wherein said control means comprises:
  a first transistor having a first collector electrically coupled to said voltage transient compensation means and a first emitter coupled to an internal ground node; and
  a second transistor having a second collector electrically coupled to a first base of said first transistor, a second base coupled to a source of supply voltage and a second emitter responsive to said signal that is electrically in phase with said input signal.

14. A circuit as recited in claim 13, further comprising at least one diode coupled between the second collector of said second transistor and the first base of said first transistor to thereby increase the voltage required on the second base of said second transistor to turn off said first transistor and disable said voltage transient compensation means.

15. A circuit for controlling the compensation of electrical transients comprising:
  input means, including an output transistor, for providing an output signal in response to an input signal;
  voltage transient compensation means coupled to said input means to prevent the switching of said output transistor in response to said electrical transients;
  a first transistor having a first base coupled to a source of supply voltage, a first emitter coupled to said input means and a first collector for providing a control signal in response to a selected input signal; and
  a second transistor having a second base coupled to said first collector, a second emitter coupled to a reference node and a second collector coupled to said voltage transient compensation means to disable said compensation means in response to said control signal.

16. A circuit as recited in claim 15, further comprising at least one diode coupled to the first collector of said first transistor at one end and the second base of said second transistor at another end for changing the voltage required on the base of said first transistor to turn off said second transistor.

17. A circuit as recited in claim 15, wherein said electrical transients are negative transients on an internal grounding node.

18. A circuit as recited in claim 15, wherein said selected input signal is a logical high level signal.

* * * * *